(12) United States Patent
Chang

(10) Patent No.: US 11,876,078 B2
(45) Date of Patent: Jan. 16, 2024

(54) THROUGH-SILICON VIA INTERCONNECTION STRUCTURE AND METHODS FOR FABRICATING SAME

(71) Applicant: Changxin Memory Technologies, Inc., Anhui (CN)

(72) Inventor: Chihwei Chang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 333 days.

(21) Appl. No.: 17/234,554

(22) Filed: Apr. 19, 2021

(65) Prior Publication Data
US 2021/0242178 A1 Aug. 5, 2021

Related U.S. Application Data

(63) Continuation of application No. PCT/CN2019/113643, filed on Oct. 28, 2019.

(30) Foreign Application Priority Data

Oct. 29, 2018 (CN) .......................... 201811270746.9
Oct. 29, 2018 (CN) .......................... 201821762014.7

(51) Int. Cl.
*H01L 25/065* (2023.01)
*H01L 21/768* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC ................. H01L 25/0657; H01L 25/50; H01L 2225/06562; H01L 21/76898;
(Continued)

(56) References Cited

U.S. PATENT DOCUMENTS

| 8,624,241 B2 * | 1/2014 | Oh ...................... H01L 25/0657 257/684 |
| 2006/0228825 A1 * | 10/2006 | Hembree .......... H01L 21/76898 257/E21.705 |

(Continued)

FOREIGN PATENT DOCUMENTS

| CN | 103378030 A | 10/2013 |
| CN | 209071319 U | 7/2019 |

OTHER PUBLICATIONS

PCT International Search Report and the Written Opinion dated Jan. 31, 2020, issued in related International Application No. PCT/CN2019/113643 (9 pages).

*Primary Examiner* — Mamadou L Diallo
(74) *Attorney, Agent, or Firm* — Sheppard Mullin Richter & Hampton LLP

(57) ABSTRACT

The present disclosure relates to semiconductor technology and provides a TSV interconnection structure and a method for fabricating same. The TSV interconnection structure may include a plurality of upper substrate structures, wherein each of the plurality of upper substrate structures is provided with a plurality of TSVs, each of the plurality of upper substrate structures is stacked on and displaced from adjacent upper substrate structures, and at least some of the TSVs of each of the plurality of upper substrate structure are connected with corresponding TSVs of the adjacent upper substrate structures; and connecting wires disposed in the plurality of TSVs and configured to connect corresponding circuits on the plurality of upper substrate structures. The present disclosure utilizes a displacement arrangement between the upper substrate structures, so that the TSVs can be displaced and connected without using RDL for a better yield, shorter the fabrication time, and low costs.

16 Claims, 7 Drawing Sheets

(51) Int. Cl.
  *H01L 23/48*    (2006.01)
  *H01L 23/544*   (2006.01)
  *H01L 25/00*    (2006.01)

(52) U.S. Cl.
  CPC ............ *H01L 23/544* (2013.01); *H01L 25/50* (2013.01); *H01L 2223/54426* (2013.01); *H01L 2225/06541* (2013.01); *H01L 2225/06562* (2013.01); *H01L 2225/06593* (2013.01)

(58) Field of Classification Search
  CPC ......... H01L 23/481; H01L 2225/06541; H01L 23/49827; H01L 23/544; H01L 2223/54426
  See application file for complete search history.

(56) References Cited

U.S. PATENT DOCUMENTS

| | | | |
|---|---|---|---|
| 2009/0127668 A1 | 5/2009 | Choi | |
| 2009/0267194 A1 | 10/2009 | Chen | |
| 2011/0108972 A1* | 5/2011 | Foster, Sr. | H01L 25/0657 257/E21.597 |
| 2012/0218024 A1* | 8/2012 | Foster, Sr. | H01L 25/0657 438/109 |
| 2020/0168595 A1* | 5/2020 | Chang | H01L 25/0657 |
| 2021/0280563 A1* | 9/2021 | Wu | H01L 25/50 |

* cited by examiner

THROUGH-SILICON VIA INTERCONNECTION STRUCTURE AND METHODS FOR FABRICATING SAME

CROSS-REFERENCE TO RELATED APPLICATIONS

This application is a continuation application of International Patent Application No. PCT/CN2019/113643, filed on Oct. 28, 2019, which is based on and claims priority to and benefits of the Chinese Patent Applications No. 201811270746.9 and No. 201821762014.7, both filed with the State Intellectual Property Office (SIPO) of the People's Republic of China on Oct. 29, 2018. The entire contents of the above-referenced applications are incorporated herein by reference.

TECHNICAL FIELD

The present disclosure relates to the field of semiconductor technology, and in particular, to a through-silicon via interconnection structure and methods for fabricating the same.

BACKGROUND

Through-Silicon Vias (TSVs) are often used to save valuable layout space or increase the efficiency of the interconnection structure. A TSV is a vertical conductive via that can completely penetrate through a substrate or a silicon wafer.

The TSV displacement in the prior art is achieved by routing metal wires, and is generally achieved by using a Re-Distribution Layer (RDL).

However, the manufacturing process of the RDL is very complicated, and the fabrication time of the RDL is very long, resulting in a high cost and a low yield.

Therefore, it is necessary to find a new through-silicon via interconnection structure and methods for fabricating the same.

It is to be noted that the above information disclosed in this Background section is only for enhancement of understanding of the background of the invention and therefore may contain information that does not form the prior art that is already known to a person of ordinary skill in the art.

SUMMARY OF THE INVENTION

The present disclosure presents through-silicon via interconnection structures and methods for fabricating the same. The structures and methods have better properties, short fabrication time, and low cost, to overcome the disadvantages of long fabrication time, high cost, and low yield of the prior art.

Other features and advantages of the present disclosure will become more apparent from the following detailed description or learned by practicing the present disclosure.

One aspect of the present disclosure may be directed to a through-silicon via (TSV) interconnection structure, comprising: a plurality of upper substrate structures, wherein each of the plurality of upper substrate structures is provided with a plurality of TSVs, each of the plurality of upper substrate structures is stacked on and displaced from adjacent upper substrate structures, and at least some of the TSVs of each of the plurality of upper substrate structure are connected with corresponding TSVs of the adjacent upper substrate structures; and connecting wires disposed in the plurality of TSVs and configured to connect corresponding circuits on the plurality of upper substrate structures.

In an exemplary embodiment of the disclosure, a bottom substrate structure may be provided, wherein the plurality of upper substrate structures may be disposed on the bottom substrate structure and connected with a circuit on the bottom substrate structure.

In an exemplary embodiment of the disclosure, each of the plurality of upper substrate structures or the bottom substrate structure may include a wafer or a chip.

In an exemplary embodiment of the disclosure, the TSV interconnection structure may further comprise at least one displacement mark provided on each of the plurality of upper substrate structures and the bottom substrate structure.

In an exemplary embodiment of the disclosure, two displacement marks are provided on each of the plurality of upper substrate structures and the bottom substrate structure.

In an exemplary embodiment of the disclosure, a pitch between the two displacement marks may be the same as a displacement between adjacent upper substrate structures or between the bottom substrate structure and an upper substrate structure disposed thereon.

In an exemplary embodiment of the disclosure, the displacement is greater than or equal to 10 μm and smaller than or equal to 60 μm.

In an exemplary embodiment of the disclosure, the TSV interconnection structure may further comprise: a plurality of contacts formed in the plurality of upper substrate structures and the bottom substrate structure, and the contacts connected with the connecting wires.

In an exemplary embodiment of the disclosure, at least one of the contacts in each of the plurality of upper substrate structures and the bottom substrate structure may not be connected with the connecting wires.

In an exemplary embodiment of the disclosure, the TSV interconnection structure further comprises: a carrier, disposed on a side of the bottom substrate structure facing away from the upper substrate structures.

Another aspect of the present disclosure may be directed to a method for fabricating a TSV interconnection structure, comprising: providing a plurality of upper substrate structures, and forming a plurality of TSVs in each of the plurality of upper substrate structures; forming connecting wires in the plurality of TSVs; sequentially bonding the plurality of upper substrate structures, wherein the plurality of upper substrate structures is displaced from adjacent upper substrate structures, at least some of the connecting wires of each upper substrate structure are connected to corresponding connecting wires of the adjacent upper substrate structures, and corresponding circuits on the plurality of upper substrate structures are connected.

Another aspect of the present disclosure may be directed to another method for or fabricating a TSV interconnection structure, comprising: providing a plurality of upper substrate structures, and sequentially bonding the plurality of upper substrate structures, wherein the plurality of upper substrate structures is displaced from adjacent upper substrate structures; forming a plurality of TSVs in the bonded plurality of upper substrate structures, wherein the plurality of TSVs penetrates through at least one of the bonded plurality of upper substrate structures; forming connecting wires in the plurality of TSVs to connect corresponding circuits on the plurality of upper substrate structures.

In an exemplary embodiment of the disclosure, the methods may further comprise: providing a bottom substrate structure; disposing the plurality of upper substrate structures on the bottom substrate structure; and connecting the plurality of upper substrate structures with a circuit on the bottom substrate structure.

In an exemplary embodiment of the disclosure, each of the plurality of upper substrate structure or the bottom substrate structure may comprise a wafer or a chip.

In an exemplary embodiment of the disclosure, the methods may further comprise: forming at least one displacement mark on each of the upper substrate structures and the bottom substrate structure, and bonding the plurality of upper substrate structures and the bottom substrate structure according to the at least one displacement mark.

In an exemplary embodiment of the disclosure, the at least one displacement mark may comprise two displacement marks.

In an exemplary embodiment of the disclosure, a pitch between the two displacement marks may be the same as a displacement between the adjacent upper substrate structures or between the bottom substrate structure and an upper substrate structure disposed thereon.

In an exemplary embodiment of the disclosure, the displacement is greater than or equal to 10 μm and smaller than or equal to 60 μm.

In an exemplary embodiment of the disclosure, the connecting wires may connect a plurality of contacts in the plurality of upper substrate structures and the bottom substrate structure, and at least one of the contacts in each of the plurality of upper substrate structures and the bottom substrate structure may not be connected with the connecting wires. In an exemplary embodiment of the disclosure, further comprising providing a carrier, and disposing the carrier on a side of the bottom substrate structure facing away from the upper substrate structure.

As can be seen from the above technical solutions, the present disclosure has at least one of the following advantages and positive effects.

In present disclosure, the through-silicon via interconnection structure and the methods for fabricating the same may include a plurality of upper substrate structures and a connecting wire; each of the plurality of upper substrate structures is provided with a plurality of TSVs, and the plurality of upper substrate structures are stacked one above another with a displacement between adjacent upper substrate structures so that at least some of the TSVs of each upper substrate structure are in communication with corresponding TSVs of an adjacent upper substrate structure; the connecting wire is disposed in the TSV and configured to connect corresponding circuits on the plurality of upper substrate structures. In one aspect, the present disclosure utilizes a displacement arrangement for the upper substrate structures such that the TSVs of the plurality of upper substrate structures are connected with a displacement between adjacent upper substrate structures, thereby satisfying the need for a TSV jumper without using the RDL, which improves the fabrication speed of the semiconductor device; on the other aspect, since no RDL is used, the number of photolithography for the RDL is reduced, therefore the yield of the semiconductor device is improved, and the fabrication time and fabrication cost are reduced.

BRIEF DESCRIPTION OF THE DRAWINGS

The features and advantages of the present disclosure will become more obvious from the detailed description of the exemplary embodiments with reference to the accompany drawings.

Figure 1:
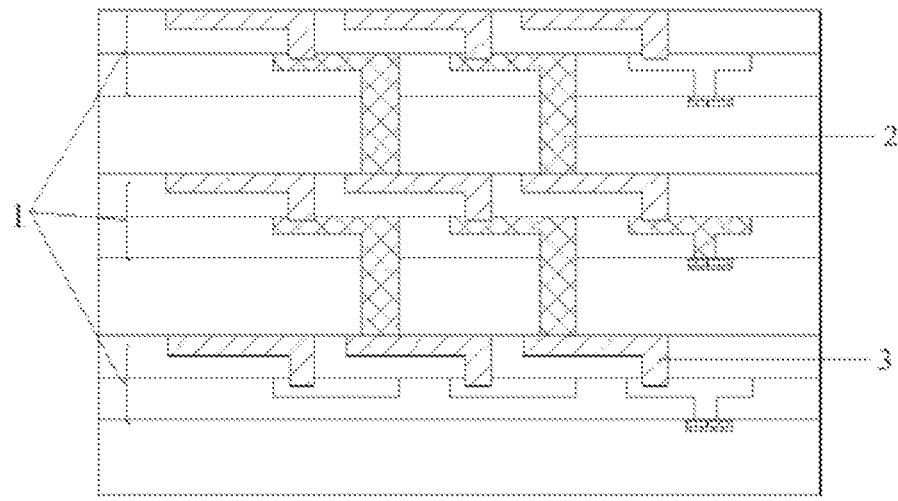
FIG. 1 is a schematic diagram of a TSV interconnection structure in the related art.

Reference numerals of main elements in these figures are described as follows:

1, RDL;
2, TSV;
3, a contact;
4, an isolating layer;
5, substrate;
6, a bottom substrate structure;
7, an upper substrate structure;
701, a chip;
8, a top carrier;
9, a first displacement mark;
10, a second displacement mark;
11, a connecting wire;
12, a bottom carrier;
N, a displacement; and
M, a pitch.

DETAILED DESCRIPTION

Exemplary embodiments will now be described more fully with reference to the accompanying drawings. However, these exemplary embodiments can be implemented in many forms and should not construe limitations to those set forth herein. Rather, these embodiments are presented to provide a full and thorough understanding of the present invention and to fully convey the concepts of the exemplary embodiments to others skilled in the art. Throughout the figures, same reference numerals indicate identical or similar elements, so any duplicate description of them will be omitted.

As shown in FIG. 1, a schematic diagram of a TSV interconnection structure in the related art is shown. In the related art, a TSV displacement is achieved by routing metal wires, and is generally achieved by using a Re-Distribution Layer (RDL). However, the manufacturing process of the RDL is very complicated, takes a long fabrication time, and has a high cost and a low yield.

Figure 2:
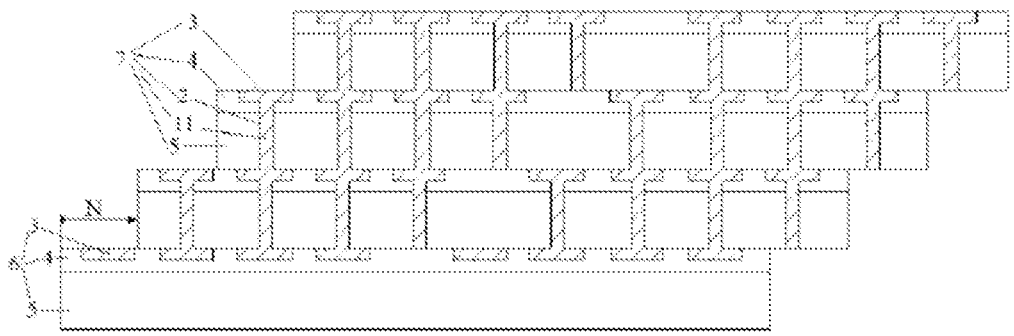
FIG. 2 is a schematic diagram of a TSV interconnection structure according to one embodiment of the present disclosure.

The embodiments of the present disclosure provide a through-silicon via (TSV) interconnection structure. Referring to FIG. 2, the TSV interconnection structure of the present disclosure may include a plurality of upper substrate structures 7 and a bottom substrate structure 6. Each of the plurality of upper substrate structures 7 may be provided with a plurality of TSVs 2, and the plurality of upper substrate structures 7 may be stacked one above another and displaced from the adjacent upper substrate structures, so that at least some of the TSVs 2 of each upper substrate structure are conducted with corresponding TSVs of adjacent upper substrate structures. A connecting wire 11, disposed in the TSV 2 and configured to connect corresponding circuits on the plurality of upper substrate structures.

In one embodiment of the present disclosure, the material of the connecting wire 11 may include integrated circuit conductive materials such as copper, polysilicon, tungsten metal, and the like. The outer layer insulating material of the TSV 2 may include integrated circuit insulating material such as silicon oxide, silicon nitride, and the like.

Figure 4:
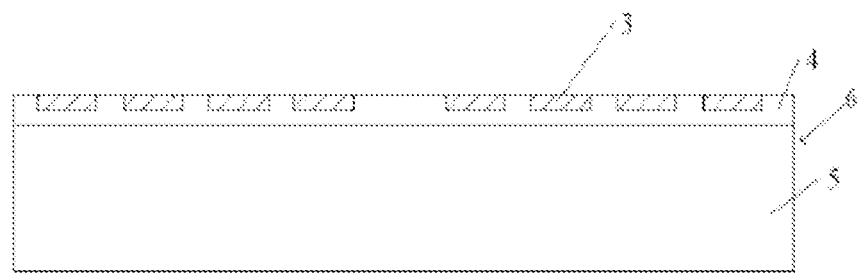
FIG. 4 is a schematic diagram of a structure of a bottom substrate structure in FIG. 2.
Figure 5:
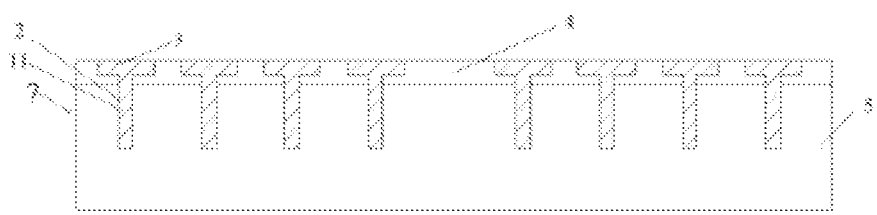
FIG. 5 is a schematic diagram of a structure of an upper substrate structure in FIG. 2.

In the embodiment of the present disclosure, referring to FIGS. 4 and 5, the TSV interconnection structure may include a bottom substrate structure 6 and at least an upper substrate structure 7. The bottom substrate structure 6 may include a substrate 5 and an isolating layer 4. A plurality of contacts 3 are disposed in the surface of the isolating layer 4. The material of the substrate may be silicon. That is, the substrate 5 is a silicon substrate. In another embodiment, the material of the substrate may be a semiconductor or an insulator, for example, glass. It is not limited in the embodiments.

In the embodiment of the present disclosure, referring to FIG. 5, the upper substrate structure 7 may include a substrate 5, an isolating layer 4, contacts 3, and a plurality of TSVs 2. The substrate 5 may be a silicon substrate. The TSVs 2 penetrate in the upper substrate structure 7.

In the embodiment of the present disclosure, referring to FIG. 4 and FIG. 5, the upper substrate structure 7 may include an upper wafer, and each of the upper substrate structures 7 may be provided with a plurality of contacts 3. The plurality of contacts 3 in the upper substrate structure may be divided into two groups in two areas, e.g. a left area and a right area. The left area is provided with four contacts 3, and the four contacts 3 are evenly distributed. The right area is also provided with four contacts 3, and the four contacts 3 are evenly distributed. The spacing between adjacent contacts 3 in each area is the same, and there is a larger spacing between the two areas. In another embodiment, the number of contacts 3 in each area may be three, five, or more. No specific limitation is imposed in the embodiments.

Referring to FIG. 5, the contacts 3 are formed in the isolating layer 4 and flush with the isolating layer 4. The TSVs 2 may be arranged perpendicularly to the contacts 3. Correspondingly, the connecting wires 11 are also arranged perpendicularly to the contacts 3, so that the upper substrate structures 7 may be stacked one above another and displaced from the adjacent upper substrate structures, and the TSVs 2 in adjacent upper substrate structures 7 may be displaced and conducted with each other. Apparently, the TSVs 2 and the contacts 3 may be disposed not perpendicularly, as long as the upper substrate structures 7 are stacked one above another and displaced from the adjacent upper substrate structures, and the TSVs 2 in adjacent upper substrate structures 7 may be displaced and conducted with each other, which is not specifically limited in the embodiment.

Figure 8:
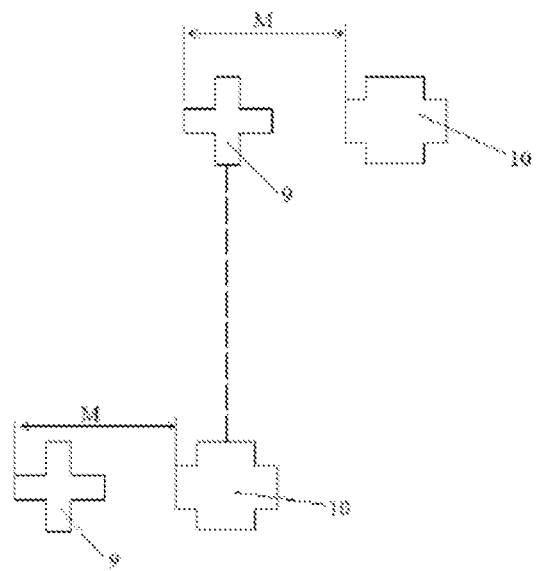
FIG. 8 is a schematic diagram of displacement marks according to one embodiment of the present disclosure.

In an embodiment of the present disclosure, FIG. 8 shows a schematic diagram of displacement marks of the embodiment of the present disclosure. The TSV interconnection structure may further include displacement marks disposed at the same positions on each of the plurality of upper substrate structures 7. Two displacement marks, e.g. a first displacement mark 9 and a second displacement mark 10, may be provided on each of the plurality of upper substrate structures. More displacement marks may be provided, which is not specifically limited in the embodiment. In another embodiment, only one displacement mark may be disposed at a certain position, e.g., a certain displacement from the side of the upper substrate structure. When a displaced bonding is performed, the upper substrate structure may be aligned with the side of another upper substrate structure with the displacement mark. In another embodiment, no displacement mark may be provided, and the displaced bonding of the plurality of upper substrate structures may be controlled by a computer, so that the plurality of upper substrate structures is displaced by a certain displacement N.

Referring to FIG. 8, the pitch M between the first displacement mark 9 and the second displacement mark 10 is the same as the displacement N between the adjacent upper substrate structures 7, so that only needs to align the displacement marks of adjacent upper substrate structures 7 for positioning. For example, the first displacement mark 9 of the upper substrate structure 7 can be aligned with the second displacement mark 10 of the bottom substrate structure 6. By arranging the displacement marks, bonding of the plurality of upper substrate structures 7 can be more accurate.

In the embodiment of the present disclosure, the displacement N may be greater than or equal to 10 μm and smaller than or equal to 60 μm. Correspondingly, the pitch M between the first displacement mark 9 and the second displacement mark 10 may be greater than or equal to 10 μm and smaller than or equal to 60 μm.

In the embodiment of the present disclosure, referring to FIG. 8, the first displacement mark 9 may be cross-shaped, and the second displacement mark 10 may also be cross-shaped. Or the shape of the two displacement marks may be a triangle, and the vertices are aligned with corresponding displaced vertices of adjacent substrate structures during the alignment. Apparently, the shape of the displacement marks may be a rectangle, a pentagon, or a hexagon, etc., which is not specifically limited in the embodiments.

In the embodiment of the present disclosure, as shown in FIG. 2, the TSV interconnection structure may comprise three upper substrate structures or more. The number of the upper substrate structures is not specifically limited in the embodiment. The plurality of upper substrate structures is stacked one above another and displaced from the adjacent upper substrate structures. The plurality of upper substrate structures may be sequentially displaced to the right with the same displacement N from bottom to top, so that the TSVs 2 in each of the plurality of upper substrate structures 7 can be conducted with displaced corresponding TSVs 2 in the adjacent substrate structures, and the connecting wires 11 provided in the TSVs 2 can also be displaced and connected with each other. In each of the upper substrate structures 7, the isolating layer 4 is provided with contacts 3. The contacts 3 may make the circuit connection between the upper substrate structures 7 more reliable.

Referring to FIG. 2, the TSVs 2 may be formed in the bonded plurality of upper substrate structures 7. The TSV 2 may be formed in the center of the contact 3 and penetrate through the plurality of upper substrate structures 7. In some regions, the TSV 2 penetrates through one of the upper substrate structures 7; in some regions, the TSV 2 penetrates through two of the upper substrate structures 7; and in some regions, the TSV 2 penetrates through more than two of the upper substrate structures 7. For example, as shown in FIG. 2, the rightmost TSV 2 of the uppermost upper substrate structure penetrates through only one of the upper substrate structures 7. Each of the upper substrate structures 7 has a contact 3 on the leftmost which is not connected to the connecting wire 11 in the TSV 2. This structure can provide a good heat dissipation effect to a certain extent.

Figure 3:
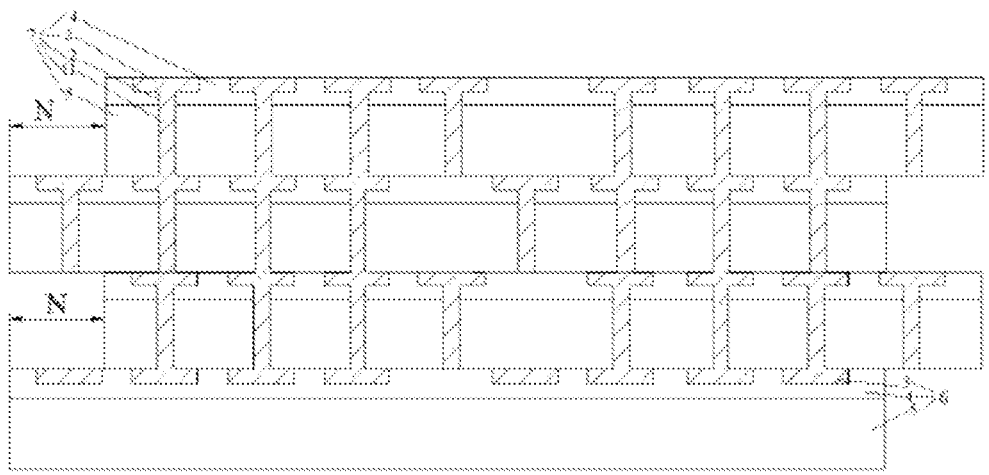
FIG. 3 is a schematic diagram of a TSV interconnection structure according to another embodiment of the present disclosure.

Apparently, in another embodiment of the present disclosure, referring to FIG. 3, the plurality of upper substrate structures may also be displaced to the left and right alternately. For example, the second upper substrate structure is displaced to the right with respect to the bottom substrate structure 6, and the third upper substrate structure is displaced to the left with respect to the second upper substrate structure. That is, the substrate structures in odd layers are aligned with each other, and the substrate structures in even layers are aligned with each other. A TSV 2 penetrates through the plurality of upper substrate structures 7 may be formed. On the one aspect, the stacked plurality of upper substrate structures 7 may occupy a small area; and on the other aspect, this kind of vertically arranged structure is stable and not easy to collapse.

Figure 13:
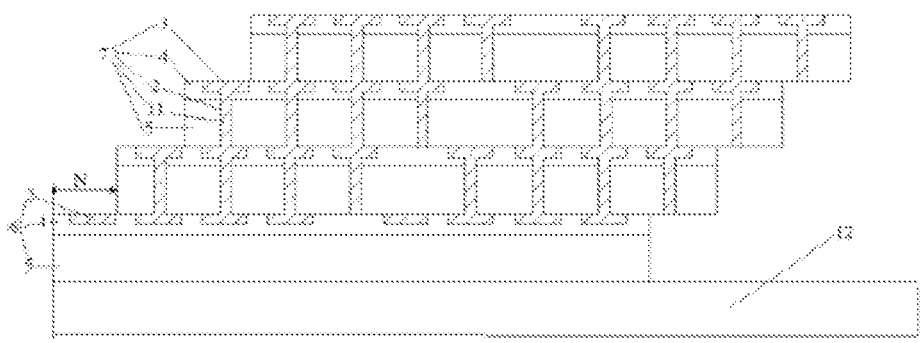
FIG. 13 is a schematic diagram of a TSV interconnection structure after a carrier is disposed according to one embodiment of the present disclosure.

Referring to FIG. 13, the TSV interconnection structure may further include a bottom carrier 12 on which the bottom substrate structure 6 is disposed. The upper substrate structures 7 may be disposed on the bottom substrate structure 6. The material of the bottom carrier 12 may be a semiconductor or an insulator, for example, glass, silicon plate, etc.

Figure 14:
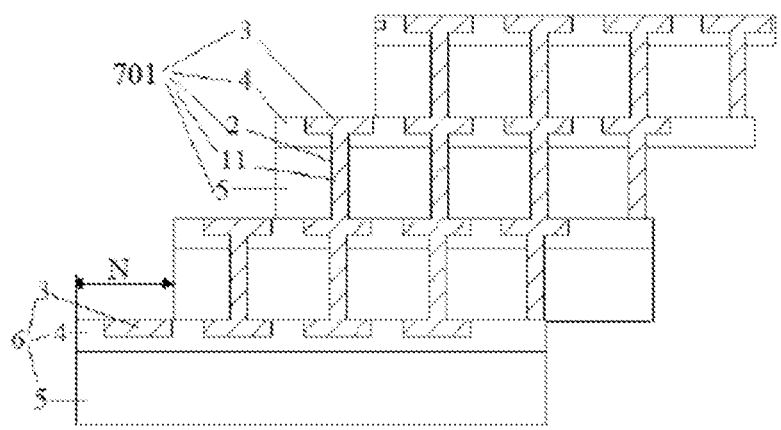
FIG. 14 is a schematic diagram of a TSV interconnection structure when the substrates structures are chips according to one embodiment of the present disclosure.

In another embodiment of the present disclosure, as shown in FIG. 14, the upper substrate structure 7 in the TSV interconnection structure may also include a chip 701. The chip 701 is disposed on the bottom substrate structure 6. The chip 701 and the bottom substrate structure 6 are sequentially stacked and displaced from each other so as to form a TSV interconnection structure. The chip 701 may include a substrate 5, an isolating layer 4, contacts 3, and TSVs 2. The substrate 5, the isolating layer 4, the contacts 3, and the TSVs 2 have been described above in detail, and therefore will not be described again herein.

Apparently, in the embodiments of the present disclosure, the TSV interconnection structure may also include a bottom carrier 12 on which the bottom substrate structure 6 is disposed. The chip 701 is disposed on the bottom substrate structure 6. The material of the bottom carrier 12 may be a semiconductor or an insulator, such as glass, silicon plate, and the like.

Figure 11:
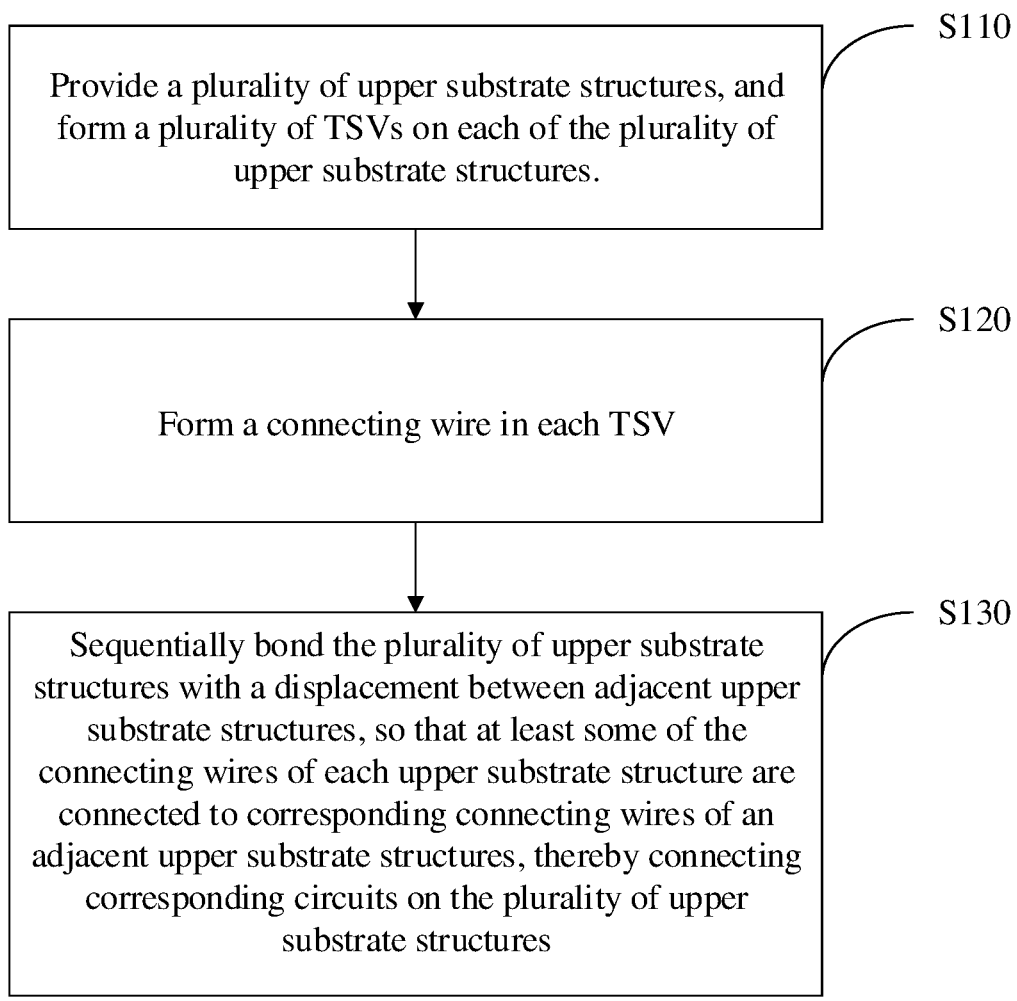
FIG. 11 is a flowchart of a method for fabricating the TSV interconnection structure according to one embodiment of the present disclosure.

Furthermore, embodiments of the present disclosure also provide a fabrication method corresponding to the above-mentioned TSV interconnection structure. As shown in FIG. 11, the method may include the following steps.

In step S110, a plurality of upper substrate structures may be provided, and a plurality of TSVs 2 may be formed on each of the plurality of upper substrate structures.

In step S120, a connecting wire 11 may be formed in each TSV 2.

In step S130, the plurality of upper substrate structures may be sequentially bonded with a displacement between adjacent upper substrate structures, so that at least some of the connecting wires 11 of each upper substrate structure may be connected to displaced corresponding connecting wires of the adjacent upper substrate structures, thereby connecting corresponding circuits on the plurality of upper substrate structures.

The various steps of the method for fabricating the TSV interconnection structure are described in detail below.

In step S110, a plurality of upper substrate structures may be provided, and a plurality of TSVs may be formed on each of the plurality of upper substrate structures.

In step S120, a connecting wire 11 may be formed in each TSV 2.

In the embodiment of the present disclosure, the connecting wire 11 is disposed in the each TSV 2, and the contact 3 may be bonded to the connecting wire 11 as shown in FIG. 5. The material of the connecting wire 11 may include integrated circuit conductive materials such as copper and tungsten metal.

Referring to FIG. 5, the upper substrate structure 7 may include a substrate 5, an isolating layer 4, contacts 3, and a plurality of TSVs 2. The substrate 5 may be a silicon substrate and the TSVs 2 penetrate in the upper substrate structure 7.

In step S130, the plurality of upper substrate structures may be sequentially bonded with a displacement between the adjacent upper substrate structures, so that at least some of the connecting wires 11 of each upper substrate structure are connected to displaced corresponding connecting wires of adjacent upper substrate structures, thereby establishing connections among corresponding circuits on the plurality of upper substrate structures.

Figure 6:
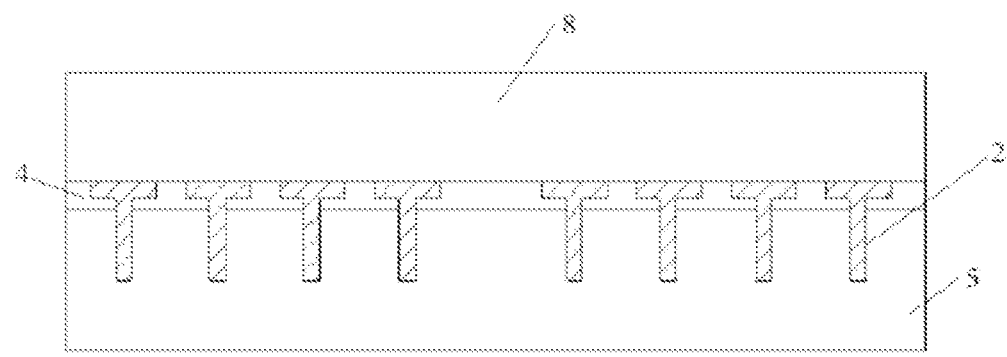
FIG. 6 is a schematic diagram showing a carrier disposed on the substrate structure in FIG. 5.

Referring to FIG. 6, first, the top carrier 8 is bonded on the upper substrate structure 7 to prevent a warpage of the upper substrate structure during subsequent grinding process because of the thin upper substrate structure. This bonding may be a temporary bonding.

Figure 7:
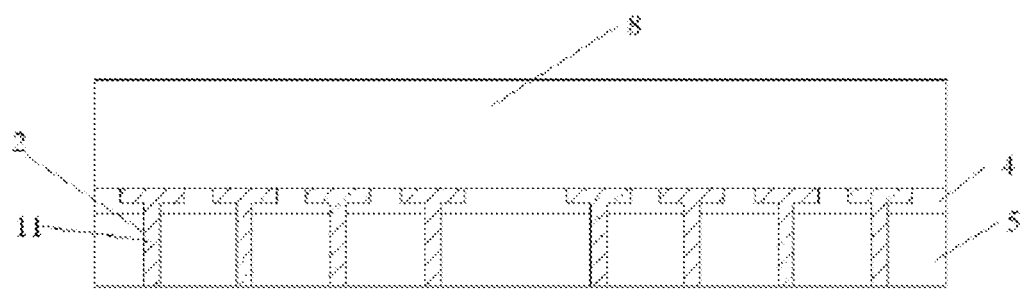
FIG. 7 is a schematic diagram showing the substrate structure in FIG. 6 after grinding.

Referring to FIG. 7, the back surface of the substrate 5 is then grinded until the connecting wires 11 are exposed, so that the above-described incompletely opened TSVs are completely through the substrate. The upper substrate structure 7 is bonded to the bottom substrate structure 6 by a chip bonding or hybrid bonding, and the first displacement mark 9 of the upper substrate structure is aligned with the second displacement mark of the bottom substrate structure 6, such that the connecting wires 11 in the upper substrate structure 7 can be connected to the contacts 3 in the bottom substrate structure 6.

Figure 9:
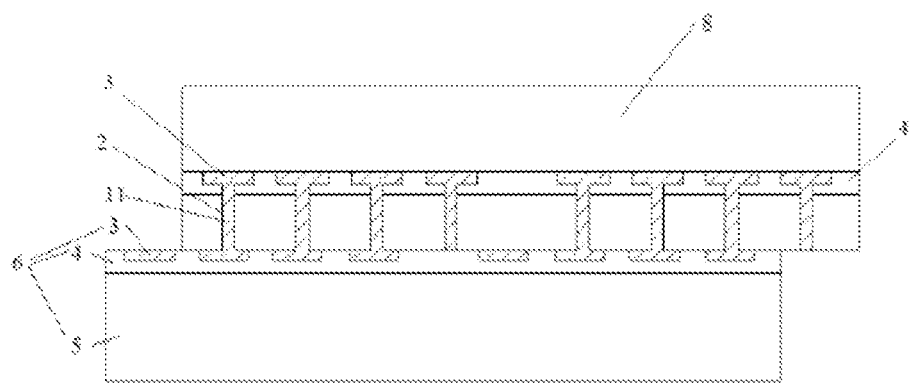
FIG. 9 is a schematic diagram showing a structure bonding an upper substrate structure and a bottom substrate structure according to one embodiment of the present disclosure.
Figure 10:
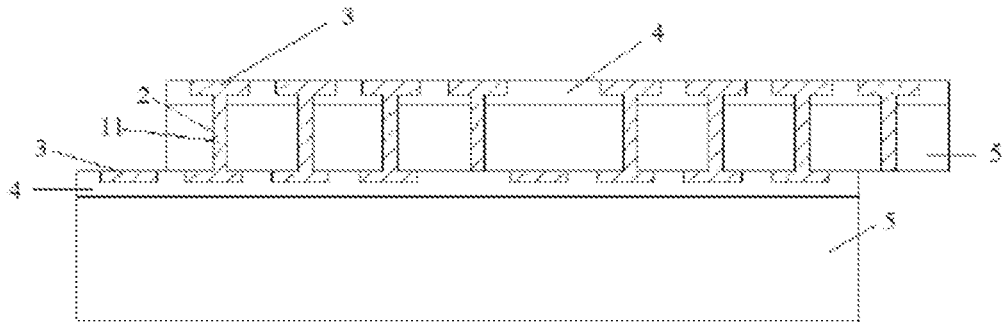
FIG. 10 is a schematic diagram showing the structure in FIG. 9 after the carrier is removed.

Referring to FIG. 9, the top carrier 8 is then detached to expose the top contacts 3 of upper substrate structure 7. The detachment can be achieved by chemical debonding, mechanical debonding, UV debonding, etc.

In the embodiment of the present disclosure, referring to FIG. 2, the steps in the above embodiments may be performed multiple times to form a multi-layer TSV structure. The TSV structure may comprise four upper substrate structures, two or three upper substrate structures, or more than four upper substrate structures, and is not specifically limited in the embodiment.

In the embodiment of the present disclosure, the upper substrate structures 7 are stacked one above another and displaced from adjacent upper substrate structures. The upper substrate structures may be sequentially displaced to the right from bottom to top with the same displacement N, so that the TSVs 2 on each of the plurality of the upper substrate structures 7 can be connected with displaced corresponding TSVs on the adjacent upper substrate structures, and the connecting wires 11 in the TSVs 2 can also be connected with displaced corresponding connecting wires in the adjacent upper substrate structures. Contacts 3 may be provided in the upper surface of each of the upper substrate structures 7. The contacts 3 may make the circuit connection among the upper substrate structures 7 more secure.

Apparently, in another embodiment of the present disclosure, referring to FIG. 3, the upper structures may also be displaced to the left and right alternately. For example, the second upper substrate structure is displaced to the right with respect to the bottom substrate structure 6, and the third upper substrate structure is displaced to the left with respect to the second upper substrate structure. That is, the substrate structures located in odd layers are aligned with each other, and the substrate structures located in even layers are also aligned with each other. The stacked plurality of upper substrate structures 7 in this arrangement occupies a small area, and the vertically arranged structure is stable and not easy to collapse.

In an embodiment of the present disclosure, FIG. 8 shows a schematic diagram of displacement marks of the present disclosure. The TSV interconnection structure may further include displacement marks disposed at the same position on each of the plurality of upper substrate structures 7. Two displacement marks, e.g. the first displacement mark 9 and the second displacement mark 10, are provided on each of the plurality of upper substrate structures. More displacement marks may be provided, which is not specifically limited in the embodiment. In another embodiment of the present disclosure, only one displacement mark may be disposed at a certain displacement N from the side of the upper substrate structure. When a displaced bonding is performed, the upper structure may be aligned with the side of another upper substrate structure with the displacement mark. In another embodiment of the present disclosure, no displacement mark is provided, and the displaced bonding of the plurality of upper substrate structures may be controlled by a computer, so that the plurality of upper substrate structures may be displaced by a certain displacement.

In the embodiment of the present disclosure, referring to FIG. 8, the first displacement mark 9 may be cross-shaped, and the second displacement mark 10 may also be cross-shaped. Or the shape of the two displacement marks may be a triangle, and the vertices may be aligned with displaced corresponding vertices during the alignment. Apparently, the shape of the displacement marks may be a rectangle, a pentagon, or a hexagon, etc., which is not specifically limited in the embodiment. In this embodiment, the pitch M between the first displacement mark 9 and the second displacement mark 10 is the same as the displacement N between adjacent upper substrate structures 7, so that only needs to align the displacement marks of adjacent upper substrate structures 7 for positioning. For example, the first displacement mark 9 of the upper substrate structure 7 can be aligned with the second displacement mark 10 of the bottom substrate structure 6. By arranging the displacement marks, bonding of the plurality of upper substrate structures 7 can be more accurate.

The displacement N may be greater than or equal to 10 μm and smaller than or equal to 60 μm. Correspondingly, the pitch M between the first displacement mark 9 and the second displacement mark 10 may be greater than or equal to 10 μm and smaller than or equal to 60 μm.

Referring to FIG. 4 and FIG. 5, each of the upper substrate structures 7 may be provided with a plurality of contacts 3.

The contacts 3 are formed in the isolating layer 4 and flush with the isolating layer 4. The plurality of contacts 3 in the upper substrate structure may be divided into two groups in two areas, e.g. the left area and the right area. The left area is provided with four contacts 3, and the four contacts 3 are evenly distributed. The right area is also provided with four contacts 3, and the four contacts 3 are evenly distributed. The spacing between adjacent contacts 3 in each area is the same, and there is a larger spacing between the two areas. In another embodiment, the number of contacts 3 in each area may be three, five, or more. No specific limitation is imposed in the embodiments.

The upper substrate structure 7 is bonded to the bottom substrate structure 6 by a chip bonding or hybrid bonding, and the first displacement mark 9 of the upper substrate structure is aligned with the second displacement mark of the bottom substrate structure 6, such that the connecting wires 11 provided in the upper substrate structure 7 can be connected to the contacts 3 provided in the bottom substrate structure 6.

Referring to FIG. 13, the TSV interconnection structure may further include a bottom carrier 12 on which the bottom substrate structure 6 is disposed. The upper substrate structure 7 is disposed on the bottom substrate structure 6. The material of the bottom carrier 12 may be a semiconductor or an insulator, for example, glass, silicon plate, etc. As the method for disposing an upper substrate structure 7 on the bottom substrate structure 6 is described above in detail, and it will not be described again herein.

In another embodiment of the present disclosure, as shown in FIG. 14, the upper substrate structure 7 in the TSV interconnection structure may also be a chip 701. The chip 701 is disposed on the bottom substrate structure 6. The chip 701 and the bottom substrate structure 6 are sequentially stacked and displaced to form a TSV interconnection structure. The chip 701 may include a substrate 5, an isolating layer 4, contacts 3, and TSVs 2. The substrate 5, the isolating layer 4, the contacts 3, and the TSVs 2 have been described above in detail, and therefore will not be described again herein.

Apparently, in this embodiment, the TSV interconnection structure may also include a bottom carrier 12 on which the bottom substrate structure 6 is disposed. The chip 701 is disposed on the bottom substrate structure 6. The material of the bottom carrier 12 may be a semiconductor or an insulator, such as glass, silicon plate, and the like.

Figure 12:
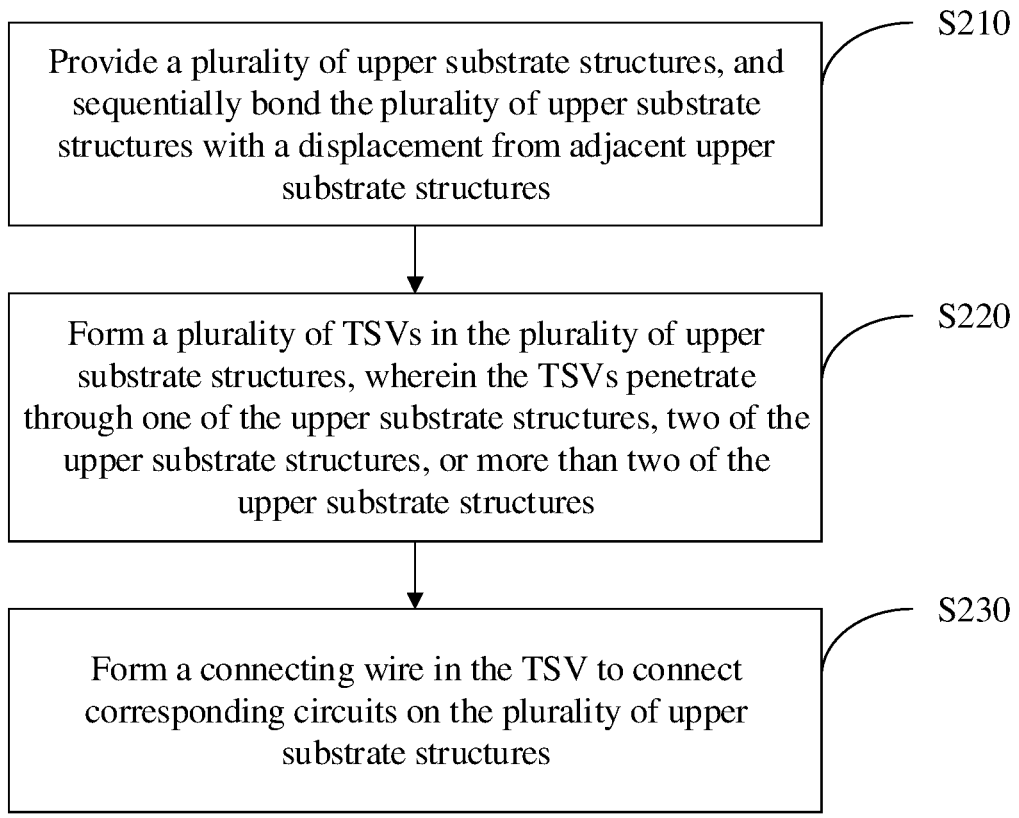
FIG. 12 is a flowchart of a method for fabricating the TSV interconnection structure according to another embodiment of the present disclosure.

In the embodiment of the present disclosure, the plasma etching and copper filling process may be completed for the TSVs 2 first, and then the plurality of upper substrate structures 7 are bonded together by a chip bonding or hybrid bonding. In another embodiment of the present disclosure, the TSV interconnection structure may be fabricated by bonding a plurality of upper substrate structures 7 first, and then performing a plasma etching and copper filling process for the TSVs 2. Therefore, another method for fabricating a TSV interconnection structure can be proposed. Another method for fabricating TSV interconnection structure will be described below. Referring to FIG. 12, the fabrication method may include the following steps.

In step S210, a plurality of upper substrate structures may be provided, and the plurality of upper substrate structures may be sequentially bonded with a displacement from adjacent upper substrate structures.

In step S220, a plurality of TSVs may be formed in the plurality of upper substrate structures. The TSVs may penetrate through one of the upper substrate structures, two of the upper substrate structures, or more than two of the upper substrate structures.

In step S230, a connecting wire may be formed in the TSV to connect corresponding circuits on the plurality of upper substrate structures.

The respective steps of the method for fabricating the TSV interconnection structure will be described in detail below.

In step S210, a plurality of upper substrate structures may be provided, and the plurality of upper substrate structures may be sequentially bonded with a displacement from adjacent upper substrate structures.

In the embodiment of the present disclosure, the TSV interconnection structure further includes a bottom substrate structure 6. Referring to FIG. 3, the bottom substrate structure 6 may include a substrate 5 and an isolating layer 4. The isolating layer 4 is provided with a plurality of contacts 3.

In one embodiment, a plurality of upper substrate structures 7 may be a plurality of upper wafers. In another embodiment, a plurality of upper substrate structures may be a plurality of chips 701 or a plurality of chips 701 mixed with an upper wafer. Referring to FIG. 3, each of the plurality of upper substrate structures 7 is provided with contacts 3. The plurality of contacts 3 disposed in the upper substrate structure 7 can be divided into two groups in two areas, e.g. a left area and a right area. The spacing between adjacent contacts 3 in each area is the same, and the spacing between the two areas is larger.

In the embodiment, a stacked structure is formed by the plurality of upper substrate structures 7 displaced according to the above-described displacement marks, then bonded together, as well as bonded to the bottom substrate structure 6. The contacts 3 in the plurality of upper substrate structures 7 are aligned with the displaced corresponding contacts 3. The upper substrate structures may be sequentially displaced to the right from bottom to top with the same displacement N.

Apparently, in another embodiment of the present disclosure, the upper substrate structures may also be displaced to the left and right alternately. For example, the second upper substrate structure is displaced to the right with respect to the bottom substrate structure 6, and the third upper substrate structure is displaced to the left with respect to the second upper substrate structure. That is, the substrate structures located in odd layers are aligned with each other, and the substrate structures located in even layers are also aligned with each other. The plurality of upper substrate structures 7 in this arrangement occupies a small area, and a vertical arranged structure is stable and not easy to collapse.

In step S220, a plurality of TSVs may be formed in the plurality of upper substrate structures 7. The plurality of TSVs may penetrate through one of the upper substrate structures, two of the upper substrate structures, or more than two of the upper substrate structures.

In the embodiment, referring to FIG. 2, TSVs 2 are formed in the bonded plurality of upper substrate structures 7. The TSV 2 may be formed in the center of the contact 3, and penetrate through the plurality of upper substrate structures 7. In some regions, the TSVs 2 penetrate through one of the upper substrate structures 7; in some regions, the TSVs 2 penetrate through two of the upper substrate structures 7; and in some regions, the TSVs 2 penetrate through more than two of the upper substrate structures 7. For example, as shown in FIG. 2, the rightmost TSV 2 of the uppermost upper substrate structure penetrates through only one of the upper substrate structures 7. Each of the upper substrate structures 7 has a contact 3 on the leftmost side which is not connected to the connecting wire 11 in the TSV 2. This structure can provide a good heat dissipation effect to a certain extent.

In step S230, a connecting wire 11 may be formed in the TSV 2 to connect corresponding circuits on the plurality of upper substrate structures.

In the embodiment, the connection wire 11 is provided in the above-described formed TSV 2 so that the circuits of the plurality of upper substrate structures are connected with each other.

Referring to FIG. 13, the TSV interconnection structure may further include a bottom carrier 12 on which the bottom substrate structure 6 is disposed. The upper substrate structure 7 is disposed on the bottom substrate structure 6. The material of the bottom carrier 12 may be a semiconductor or an insulator, for example, glass, silicon plate, etc. The method for disposing the upper substrate structure 7 on the bottom substrate structure 6 has been described in detail above, and therefore will not be described again herein.

In another embodiment of the present disclosure, as shown in FIG. 14, the upper substrate structure 7 of the TSV interconnection structure may also be a chip 701. The chip 701 is disposed on the bottom substrate structure 6. The chip 701 and the bottom substrate structure 6 are sequentially stacked and displaced to form a TSV interconnection structure. The chip 701 may include a substrate 5, an isolating layer 4, contacts 3, and TSVs 2. The substrate 5, the isolating layer 4, the contacts 3, and the TSVs 2 have been described in detail above, and therefore will not be described again herein.

Apparently, in the embodiment, the TSV interconnection structure may further include a bottom carrier 12 on which the bottom substrate structure 6 is disposed. The chip 701 is disposed on the bottom substrate structure 6. The material of the bottom carrier 12 may be a semiconductor or an insulator, for example, glass, silicon plate, etc.

The features, structures, or characteristics described above may be combined in any suitable manners in one or more embodiments, and the features discussed in the various embodiments are interchangeable, if possible. In the above description, numerous specific details are set forth to provide a comprehensive understanding for the embodiments of the present disclosure. However, one skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "upper" and "lower" may be used herein to describe a spatial relationship of one component to another shown in the figures, they are used merely for the purpose of easy description based on, for example, the exemplary orientation depicted in the figures. It is to be understood that if the illustrated device is turned upside down, then the component described as being "upper" will now be a "lower" component. Other relative terms such as "high", "low", "top", "bottom" have similar meanings. When a certain structure is described as being "on" another structure, it is possible that the specific structure is either integrally formed on the other structure or disposed thereon "directly" or "indirectly" via an intermediate structure.

As used herein, the terms "a", "an", "the", "said" and "at least one" are intended to mean that there is one or more elements/components/etc. As used herein, the terms "comprising" and "having" are intended to be used in an open-ended sense to mean that there are possibly other element(s)/component(s)/etc. apart from the listed element(s)/component(s)/etc. The terms "first", "second", "third", etc. as used herein are meant as labels rather than place a quantitative limitation upon the amount of the mentioned items.

It should be understood that the present disclosure does not limit its application to the detailed structure and arrangement of the components proposed in the present disclosure. The present disclosure is capable of having other embodiments and may be implemented and executed by various embodiments. The foregoing variations and modifications fall within the scope of the present disclosure. It is to be understood that the present disclosure extends to all alternative combinations of two or more of the individual features mentioned by the specification and figures or apparent herein. All of these different combinations constitute a number of alternative aspects of the present disclosure. The embodiments described in the specification are illustrative of the preferable embodiments for carrying out the invention and will enable those skilled in the art to utilize the invention.

What is claimed is:

1. A through-silicon via (TSV) interconnection structure, comprising:
    a plurality of upper substrate structures, wherein each of the plurality of upper substrate structures is provided with a plurality of TSVs, each of the plurality of upper substrate structures is stacked on and displaced from adjacent upper substrate structures, and at least some of the TSVs of each of the plurality of upper substrate structure are connected with corresponding TSVs of the adjacent upper substrate structures; and
    connecting wires disposed in the plurality of TSVs and configured to connect corresponding circuits on the plurality of upper substrate structures,
    a bottom substrate structure, wherein the plurality of upper substrate structures are disposed on the bottom substrate structure and connected with a circuit on the bottom substrate structure, and
    at least one displacement mark provided on each of the plurality of upper substrate structures and the bottom substrate structure.

2. The TSV interconnection structure of claim 1, wherein each of the plurality of upper substrate structures or the bottom substrate structure includes a wafer or a chip.

3. The TSV interconnection structure of claim 1, wherein the at least one displacement mark comprises two displacement marks.

4. The TSV interconnection structure of claim 3, wherein a pitch between the two displacement marks is the same as a displacement between the adjacent upper substrate structures or between the bottom substrate structure and an upper substrate structure disposed thereon.

5. The TSV interconnection structure of claim 4, wherein the displacement is greater than or equal to 10 μm and smaller than or equal to 60 μm.

6. The TSV interconnection structure of claim 1, further comprising:
    a plurality of contacts formed in the plurality of upper substrate structures and the bottom substrate structure, and the contacts connected with the connecting wires.

7. The TSV interconnection structure of claim 6, wherein at least one of the contacts in each of the plurality of upper substrate structures and the bottom substrate structure is not connected with the connecting wires.

8. The TSV interconnection structure of claim 1, further comprising:
    a carrier, disposed on a side of the bottom substrate structure facing away from the upper substrate structures.

9. A method for fabricating a TSV interconnection structure, comprising:
    providing a plurality of upper substrate structures, and forming a plurality of TSVs in each of the plurality of upper substrate structures;
    forming connecting wires in the plurality of TSVs;
    sequentially bonding the plurality of upper substrate structures, wherein the plurality of upper substrate structures is displaced from adjacent upper substrate structures, at least some of the connecting wires of each upper substrate structure are connected to corresponding connecting wires of the adjacent upper substrate structures, and corresponding circuits on the plurality of upper substrate structures are connected;
    providing a bottom substrate structure, wherein the plurality of upper substrate structures are disposed on the bottom substrate structure and connected with a circuit on the bottom substrate structure, and
    forming a plurality of contacts formed in the plurality of upper substrate structures and the bottom substrate structure, and the contacts connected with the connecting wires,
    wherein at least one of the contacts in each of the plurality of upper substrate structures and the bottom substrate structure is not connected with the connecting wires.

10. A method for fabricating a TSV interconnection structure, comprising:
    providing a plurality of upper substrate structures, and sequentially bonding the plurality of upper substrate structures, wherein the plurality of upper substrate structures is displaced from adjacent upper substrate structures;
    forming a plurality of TSVs in the bonded plurality of upper substrate structures, wherein the plurality of TSVs penetrates through at least one of the bonded plurality of upper substrate structures;
    forming connecting wires in the plurality of TSVs to connect corresponding circuits on the plurality of upper substrate structures;
    providing a bottom substrate structure;
    disposing the plurality of upper substrate structures on the bottom substrate structure; and
    connecting the plurality of upper substrate structures with a circuit on the bottom substrate structure;
    forming at least one displacement mark on each of the upper substrate structures and the bottom substrate structure, and bonding the plurality of upper substrate structures and the bottom substrate structure according to the at least one displacement mark.

11. The method for fabricating a TSV interconnection structure of claim 10, wherein each of the plurality of upper substrate structure or the bottom substrate structure comprises a wafer or a chip.

12. The method for fabricating a TSV interconnection structure of claim 10, wherein the at least one displacement mark comprises two displacement marks.

13. The method for fabricating a TSV interconnection structure of claim 12, wherein a pitch between the two displacement marks is the same as a displacement between the adjacent upper substrate structures or between the bottom substrate structure and an upper substrate structure disposed thereon.

14. The method for fabricating a TSV interconnection structure of claim 12, wherein the displacement is greater than or equal to 10 μm and smaller than or equal to 60 μm.

15. The method for fabricating a TSV interconnection structure of claim 10, wherein
the connecting wires connect a plurality of contacts in the plurality of upper substrate structures and the bottom substrate structure, and at least one of the contacts in each of the plurality of upper substrate structures and the bottom substrate structure is not connected with the connecting wires.

16. The method for fabricating a TSV interconnection structure of claim 10, further comprising:
providing a carrier; and
disposing the carrier on a side of the bottom substrate structure facing away from the upper substrate structure.

* * * * *